United States Patent Office 3,046,120
Patented July 24, 1962

3,046,120

LIGHT-SENSITIVE LAYERS FOR PHOTO-MECHANICAL REPRODUCTION

Maximilian Paul Schmidt and Oskar Süs, Wiesbaden-Biebrich, Germany, assignors, by mesne assignments, to Azoplate Corporation, Murray Hill, N.J.

No Drawing. Original application Nov. 30, 1954, Ser. No. 472,224. Divided and this application Feb. 14, 1958, Ser. No. 715,224
Claims priority, application Germany Oct. 31, 1950
19 Claims. (Cl. 96—33)

This invention relates to light-sensitive materials suitable for use in the field of photomechanical reproduction. The present materials are particularly suitable for use in planographic printing or lithography. The new materials are provided with light-sensitive layers containing water-insoluble resinlike esters of the sulfonic acids of quinone-(1,2)-diazides as light-sensitive substances.

A large variety of compositions have been used for the light-sensitive layer in the art of photomechanical reproduction. Such layers are formed primarily from a colloid, such as albumin, rubber, gelatin, or a synthetic product, such as polyvinyl alcohol, to which a light-sensitive substance is added. In application Serial No. 174,-556, now abandoned, planographic printing plates are described in which the colloid is omitted and a light-sensitive substance alone is used for producing the light-sensitive layer on the base material which may be a metal plate, plastic foil, or stone plate. The light-sensitive substance is applied to this base in the form of a solution and after drying is exposed under a pattern and developed to form an ink receptive image which can be used for producing reproductions in the well known manner.

It has now been found that water insoluble resin-like esters of sulfonic acids of orthodiazophenols, the so-called quinone-(1,2)-diazides, in particular those of ortho-naphthoquinone-diazides, are extremely well suited for producing light-sensitive layers for use in photo-mechanical reproduction processes.

The resin-like sulfonic acid ester may be dissolved in an organic solvent and applied to the base material from such a solution. After exposure to a light image and subsequent development, this light-sensitive material is provided with an ink receptive image which adheres excellently to the base material and consequently can advantageously serve as a printing plate for the printing of a large number of copies. This favorable result is presumably brought about by the fact that the resin-like sulfonic acid esters used in accordance with this invention do not become crystalline and consequently are less subject to abrasion during the process of printing.

Those compounds which are produced by the condensation of resins, in particular of alkali-soluble phenolformaldehyde resins, with ortho-diazo-naphthol sulfochlorides in the presence of alkali and preferably of some organic solvent are particularly useful resin-like sulfonic acid esters of quinone-(1,2)-diazides for the purpose of the present invention. In this connection, the term phenolformaldehyde resin is understood to cover quite generally resins that have been produced from phenols or substituted phenols in the presence of acids or bases and which are soluble in alkali.

As already mentioned above, the light-sensitive layer is advantageously produced on the base by dissolving a resin-like ester of a sulfonic acid of a quinone-(1,2)-diazide in an organic solvent or mixture of solvents and by applying the resulting solution to the base material. The application of the solution may be effected by the well known methods of centrifuging, brushing, roller coating, etc. The dried layer is then exposed to a light image. For example, it may be held in contact with a master pattern and exposed to light through the master or it may be exposed to a projected light image. Subsequently, the exposed film is developed with a dilute alkaline solution which will not dissolve the resin-like ester, but which will dissolve the light decomposition products thereof. Such alkaline solutions are for example, solutions of disodium phosphate of trisodium phosphate or alkaline buffer solutions. The developing treatment generally requires no more than wiping the exposed layer with a cotton pad soaked in the developing solution and subsequent rinsing with water. The areas struck by light are removed by this treatment and the image is thus developed.

It is also possible to use dilute solutions of other alkalies, e.g. sodium carbonate, triethanolamine, sodium hydroxide, or mixtures of these solutions may be used instead of the phosphatic solutions mentioned above. In order to improve the effect exerted upon the exposed layer, there may be added to the alkaline solution used during development a wetting agent and/or solvent, such as alcohol and/or colloid such as gum arabic or dextrin, and/or agents that keep metal oxides in solution, such as the sodium salt of amino-tri-acetic acid. For practical reasons the weakest alkali that is capable of removing the non-printing portions of the layer should be chosen.

If the developed image is to be used as such, it is expedient to previously add coloring matter to the light-sensitive layer. The exposed areas of the base material repel lithographic ink if the base has a hydrophilic surface, while the areas covered by the image, i.e., the areas not affected by light, accept greasy ink. Consequently, the image can be used in a planographic printing apparatus for the production of duplicates. It is, however, possible also to heat the developed image to a higher temperature in order to obtain a more strongly colored image or to etch the developed material in a well known manner for the purpose of obtaining an etched plate or cliché, for example in cases where glass or metal is used as the base material.

Resins or dyestuffs may be added to the solution of the resin-like sulfonic acid ester to be used in accordance with this invention, and in some cases even better results will be obtained.

Among other base materials that can be used, the following are well suited: metal plates or metal fabrics, superficially oxidized aluminum plates, lithographic stones, and glass.

The following examples are inserted in order to illustrate the present invention:

(1) A 2.5 percent solution in 50 parts of alcohol and 50 parts of methyl-ethyl-ketone of the condensation product of an o-cresol-formaldehyde resin as described in the German Patent DRP No. 281,454 and of naphthoquinone-(1,2)-diazide-(2)-5-sulfochloride is applied to a superficially oxidized aluminum foil to form a thin layer. After drying, this layer is exposed to light under a master pattern. The image is then developed with a 5 percent solution of trisodium phosphate and rinsed with water and after acidifying the plate it can be used for printing in a commercial printing machine.

(2) A thin layer of a dioxane solution containing 3 percent of the condensation product used in Example 1 and 1.5 percent of shellac is applied in the customary manner to a zinc plate that has been scoured with water and pumice powder and has subsequently been treated with 2 percent nitric acid in order to give it a hydrophilic surface. Subsequent to drying, this layer is exposed to light under a transparent positive and then bathed in a 3 percent solution of trisodium phosphate in order to develop the image. The image is then rinsed with water, treated with a solution of acid salts, as described, for instance, by Strecker in German Patent No. 642,782, rinsed again with water, and then dried. It is advisable to apply lithographic ink prior to drying. Subsequently, the plate may be etched with nitric acid in the customary manner for the purpose of producing a stereotype (cliché). The procedure in producing etched images on glass is quite similar, the essential difference residing in the use of hydrofluoric acid instead of nitric acid for the purpose of producing the etched image. Dyes, for example Sudan blue, can also be added to the layer, whereby a blue image is obtained on the glass after the exposure of the layer and its alkaline development.

The procedure to be followed in producing the condensation product employed in Examples 1 and 2 is as follows: 22 parts by weight of an o-cresol-formaldehyde resin, produced in accordance with German Patent No. 281,454, are dissolved in 150 parts by volume of dioxane (diethylene dioxide). To this solution there is added a solution of 54 parts by weight of naphthoquinone-(1,2)-diazide-(2)-5-sulfochloride in 250 parts by volume of dioxane. 100 parts by volume of water are then added, and subsequently 200 parts by volume of a 10 percent soda solution are slowly added while the mixture is heated slightly. An oil separates, which, however, gradually solidifies. The light yellow product is separated from the solution and finely ground with water. Finally it is rendered alkaline with dilute sodium hydroxide, filtered with suction, neutralized by washing with water and dried.

Products obtained by the condensation of phenol-formaldehyde resins with an isomeric naphthoquinone-diazide-sulfochloride, for example with naphthoquinone-(1,2)-diazide-(2)-4-sulfochloride, can be used with equal success.

It is also possible to use industrially produced alkali soluble phenol-formaldehyde resins in place of the o-cresol-formaldehyde resin conforming to German Patent No. 281,454 for condensation with a quinone-(1,2)-diazide-sulfochloride. For example, the formaldehyde-phenol resin novolak which is sold by the Chemische Werke Albert, Wiesbaden-Biebrich (Germany), under the trade name "Alnovol 429," and naphthoquinone-(1,2)-diazide-(2)-5-sulfochloride will yield a light yellow condensation product that disintegrates at a temperature of approximately 137° C. and can be employed, dissolved in a solution consisting of dioxane and methyl ethyl ketone, for the production of light-sensitive layers.

(3) A 2 percent solution in glycolmonomethylether of the condensation product of 5-methylbenzoquinone-(1,2)-diazide-(2)-4-sulfochloride and a formaldehyde-o-cresol resin, conforming to German Patent No. 281,454 is whirlcoated on an aluminum foil which has been mechanically roughened on its surface. This layer is dried with the aid of a fan. After exposure to light under a master, the image is developed with a 2 percent solution of trisodium phosphate, rinsed with water and subsequently made ready for printing by wiping with a 1 percent solution of phosphoric acid. Positive printing plates are obtained from positive masters.

The above-mentioned resin-like diazo compound may be obtained by heating 5-methyl-benzoquinone-(1,2)-diazide-(2)-4-sulfonic acid with chlorosulfonic acid, thus converting the sulfonic acid to the corresponding sulfonic acid chloride. The so formed acid chloride must be precipitated while cooling intensively, for example by adding the reaction mixture drop by drop into a solution of sodium chloride containing carefully dispersed, small pieces of ice. The melting point of this acid chloride after recrystallization from a mixture of water and dioxane is 111° C. with decomposition.

In order to condense the sulfochloride with the o-cresol-formaldehyde resin, the acid chloride dissolved in dioxane is dropped, while stirring, into a solution of the resin in a normal sodium hydroxide solution. After standing for some hours, the product is filtered, washed with water and dried on a clay shard. When heated it begins darkening at 240° C. and chars slowly.

(4). A 1 percent solution in glycolmonomethylether of the condensation product of benzoquinone-(1,2)-diazide-(2)-4-sulfochloride with the phenolformaldehyde resin-novolak, sold by the Chemische Werke Albert, Wiesbaden-Biebrich (Germany), under the trade name "Alnovol 429," is whirlcoated on an aluminum foil which is mechanically roughened on its surface and this layer is dried with the aid of a fan. After exposure to light under a master, the image is developed with a 2 percent solution of trisodium phosphate and made ready for printing as described in Example 3. The printing plate is characterized by very good stability against acid and alkali.

The above-mentioned condensation product may be obtained by adding dropwise with constant stirring into a normal sodium hydroxide solution of the phenol-formaldehyde resin-novolak, a dioxane solution of benzoquinone-(1,2)-diazide-(2)-4-sulfochloride, prepared according to the method used for the homologous sulfonic acid chloride as described in Example 3. The precipitated condensation product is separated from the always alkaline reaction mixture by filtering with suction and washing with water. After heating this condensation product in a capillary tube, it begins darkening at 220° C. and chars at a somewhat higher temperature.

This application is a division of copending application Serial No. 472,224, filed November 30, 1954, which, in turn, is a continuation-in-part of application Serial No. 252,794, filed October 23, 1951, and now abandoned.

What is claimed is:

1. A presensitized printing plate comprising a base material having a coating thereon comprising the condensation product of a sulfonic acid halide of a quinone-(1,2)-diazide and a phenol-formaldehyde resin.

2. A presensitized printing plate comprising a base material having a coating thereon comprising the condensation product of a phenol-formaldehyde resin and a sulfonic acid halide selected from the group consisting of sulfonic acid halides of quinone-(1,2)-diazides of the benzene and naphthalene series.

3. A presensitized printing plate comprising a base material having a coating thereon comprising the condensation product of a sulfonic acid halide of a naphthoquinone-(1,2)-diazide and a phenol-formaldehyde resin.

4. A presensitized printing plate according to claim 4 in which the base material is sheet aluminum.

5. A presensitized printing plate comprising a base material having a coating thereon comprising the condensation product of a sulfonic acid halide of a quinone-(1,2)-diazide and an o-cresol formaldehyde resin.

6. A presensitized printing plate comprising a base material having a coating thereon comprising the condensation product of naphthoquinone-(1,2)-diazide-(2)-5-sulfonic acid halide and a phenol-formaldehyde resin.

7. A presensitized printing plate comprising a base material having a coating thereon comprising the condensation product of naphthoquinone-(1,2)-diazide-(2)-4-sulfonic acid halide and a phenol-formaldehyde resin.

8. A presensitized printing plate comprising a base material having a coating thereon comprising the condensation product of 5-methylbenzoquinone-(1,2)-diazide-(2)-4-sulfonic acid halide and a phenol-formaldehyde resin.

9. A presensitized printing plate comprising a base material having a coating thereon comprising the condensation product of benzoquinone-(1,2)-diazide-(2)-4-sulfonic acid halide and a phenol-formaldehyde resin.

10. A presensitized printing plate comprising a base material having a coating thereon comprising the condensation product of a sulfonic acid halide of a benzoquinone-(1,2)-diazide and a phenol-formaldehyde resin.

11. A process for producing a printing plate which comprises exposing a base material having a layer thereon to light under a master and treating the exposed layer with an alkaline medium, the layer comprising the condensation product of a sulfonic acid halide of a quinone-(1,2)-diazide and a phenol-formaldehyde resin.

12. A process for producing a printing plate which comprises exposing a base material having a layer thereon to light under a master and treating the exposed layer with an alkaline medium, the layer comprising the condensation product of a phenol-formaldehyde resin and a sulfonic acid halide selected from the group consisting of sulfonic acid halides of quinone-(1,2)-diazides of the benzene and naphthalene resins.

13. A process for producing a printing plate which comprises exposing a base material having a layer thereon to light under a master and treating the exposed layer with an alkaline medium, the layer comprising the condensation product of a sulfonic acid halide of a naphthoquinone-(1,2)-diazide and a phenol-formaldehyde resin.

14. A process for producing a printing plate which comprises exposing a base material having a layer thereon to light under a master and treating the exposed layer with an alkaline medium, the layer comprising the condensation product of a sulfonic acid halide of a quinone-(1,2)-diazide and an o-cresol formaldehyde resin.

15. A process for producing a printing plate which comprises exposing a base material having a layer thereon to light under a master and treating the exposed layer with an alkaline medium, the layer comprising the condensation product of naphthoquinone-(1,2)-diazide-(2)-5-sulfonyl chloride and a phenol-formaldehyde resin.

16. A process for producing a printing plate which comprises exposing a base material having a layer thereon to light under a master and treating the exposed layer with an alkaline medium, the layer comprising the condensation product of naphthoquinone-(1,2)-diazide-(2)-4-sulfonyl chloride and a phenol-formaldehyde resin.

17. A process for producing a printing plate which comprises exposing a base material having a layer thereon to light under a master and treating the exposed layer with an alkaline medium, the layer comprising the condensation product of 5-methylbenzoquinone-(1,2)-diazide-(2)-4-sulfonyl chloride and a phenol-formaldehyde resin.

18. A process for producing a printing plate which comprises exposing a base material having a layer thereon to light under a master and treating the exposed layer with an alkaline medium, the layer comprising the condensation product of benzoquinone-(1,2)-diazide-(2)-4-sulfonyl chloride and a phenol-formaldehyde resin.

19. A process for producing a printing plate which comprises exposing a base material having a layer thereon to light under a master and treating the exposed layer with an alkaline medium, the layer comprising the condensation product of a sulfonic acid halide of a benzoquinone-(1,2)-diazide and a phenol-formaldehyde resin.

References Cited in the file of this patent

FOREIGN PATENTS 865,860 Germany ---------------- Feb. 5, 1953

OTHER REFERENCES

PB 44,231, published June 13, 1947, Frame 1610. (Copy in Div. 60.)

Ellis: Chemistry of Synthetic Resins, combined edition. Copyright, 1935, Rheinhold Pub., N.Y., page 422. (Copy in Sci. Library.)